US009603284B2

(12) United States Patent
Lyon

(10) Patent No.: US 9,603,284 B2
(45) Date of Patent: Mar. 21, 2017

(54) FLUID HEAT EXCHANGER CONFIGURED TO PROVIDE A SPLIT FLOW

(71) Applicant: COOLIT SYSTEMS INC., Calgary (CA)

(72) Inventor: Geoff Sean Lyon, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

(21) Appl. No.: 14/283,163

(22) Filed: May 20, 2014

(65) Prior Publication Data

US 2014/0251582 A1    Sep. 11, 2014

Related U.S. Application Data

(63) Continuation of application No. 12/189,476, filed on Aug. 11, 2008, now Pat. No. 8,746,330.
(Continued)

(51) Int. Cl.
*H05K 7/20* (2006.01)
*H01L 23/473* (2006.01)
*F28D 15/00* (2006.01)

(52) U.S. Cl.
CPC ......... *H05K 7/20254* (2013.01); *F28D 15/00* (2013.01); *H01L 23/473* (2013.01); *H01L 2924/0002* (2013.01)

(58) Field of Classification Search
CPC ........... H05K 7/20218; H05K 7/20254; H05K 7/20263; H05K 7/20272; H01L 23/4735; H01L 23/473
(Continued)

(56) References Cited

U.S. PATENT DOCUMENTS

| 4,450,472 A | 5/1984 | Tuckerman et al. |
| 4,561,040 A | 12/1985 | Eastman et al. |

(Continued)

FOREIGN PATENT DOCUMENTS

| JP | 61032449 | 2/1986 | | |
| JP | 06120387 A | * | 4/1994 | ........... H01L 23/473 |

(Continued)

OTHER PUBLICATIONS

Technical Opinion dated Jan. 10, 2013, for Japanese Registration No. 3179086 (Utility Model Application No. 2012-002117); English translation included; 7 pages.
(Continued)

*Primary Examiner* — Leonard R Leo
(74) *Attorney, Agent, or Firm* — Ganz Pollard LLC

(57) ABSTRACT

A fluid heat exchanger can define a plurality of microchannels each having a first end and an opposite end and extending substantially parallel with each other microchannel. Each microchannel can define a continuous channel flow path between its respective first end and opposite end. A fluid inlet opening for the plurality of microchannels can be positioned between the microchannel first and opposite ends, a first fluid outlet opening from the plurality of microchannels can be positioned adjacent each of the microchannel first ends, and an opposite fluid outlet opening from the plurality of microchannels can be positioned adjacent each of the microchannel opposite ends such that a flow of heat transfer fluid passing into the plurality of microchannels flows along the full length of each of the plurality of microchannels outwardly from the fluid inlet opening. Related methods are disclosed.

32 Claims, 2 Drawing Sheets

Related U.S. Application Data

(60) Provisional application No. 60/954,987, filed on Aug. 9, 2007.

(58) Field of Classification Search
USPC .................. 165/80.4, 170; 361/699; 257/714
See application file for complete search history.

(56) References Cited

U.S. PATENT DOCUMENTS

| | | | |
|---|---|---|---|
| 4,750,086 A | | 6/1988 | Mittal |
| 4,758,926 A | * | 7/1988 | Herrell et al. ................ 361/699 |
| 4,768,581 A | * | 9/1988 | Gotwald et al. ............ 165/80.3 |
| 4,898,153 A | | 2/1990 | Sherwood |
| 4,909,315 A | * | 3/1990 | Nelson ................ H01L 23/4336 165/80.4 |
| 4,940,085 A | | 7/1990 | Nelson et al. |
| 5,016,090 A | * | 5/1991 | Galyon .............. H01L 23/4336 257/714 |
| 5,070,936 A | | 12/1991 | Carroll |
| 5,099,311 A | * | 3/1992 | Bonde et al. ................ 165/80.4 |
| 5,203,401 A | * | 4/1993 | Hamburgen et al. ........ 165/80.4 |
| 5,218,515 A | * | 6/1993 | Bernhardt ............ H01L 23/473 361/699 |
| 5,265,670 A | | 11/1993 | Zingher |
| 5,294,830 A | | 3/1994 | Young et al. |
| 5,309,319 A | | 5/1994 | Messina |
| 5,441,102 A | | 8/1995 | Burward-Hoy |
| 5,453,641 A | | 9/1995 | Mundinger et al. |
| 5,592,363 A | * | 1/1997 | Atarashi et al. ............. 361/699 |
| 5,727,618 A | | 3/1998 | Mundinger et al. |
| 5,823,249 A | | 10/1998 | Batchelder |
| 5,998,240 A | | 12/1999 | Hamilton et al. |
| 6,019,165 A | | 2/2000 | Batchelder |
| 6,415,860 B1 | | 7/2002 | Kelly et al. |
| 6,447,270 B1 | | 9/2002 | Schmidt et al. |
| 6,679,315 B2 | | 1/2004 | Cosley et al. |
| 6,702,002 B2 | | 3/2004 | Wang |
| 6,827,128 B2 | | 12/2004 | Philpott et al. |
| 6,952,345 B2 | | 10/2005 | Weber et al. |
| 6,986,382 B2 | | 1/2006 | Upadhya et al. |
| 6,988,534 B2 | | 1/2006 | Kenny et al. |
| 7,000,684 B2 | | 2/2006 | Kenny et al. |
| 7,007,506 B2 | | 3/2006 | Kubo et al. |
| 7,021,367 B2 | | 4/2006 | Oikawa |
| 7,032,651 B2 | * | 4/2006 | Winslow et al. ............ 165/80.4 |
| 7,104,312 B2 | | 9/2006 | Goodson et al. |
| 7,124,811 B2 | | 10/2006 | Crocker et al. |
| 7,131,486 B2 | | 11/2006 | Goodson et al. |
| 7,156,159 B2 | | 1/2007 | Lovette et al. |
| 7,201,217 B2 | * | 4/2007 | Johnson et al. ............ 165/80.4 |
| 7,209,355 B2 | | 4/2007 | Koga et al. |
| 7,264,359 B2 | | 9/2007 | Kawahara et al. |
| 7,274,566 B2 | | 9/2007 | Campbell et al. |
| 7,301,771 B2 | | 11/2007 | Hata et al. |
| 7,466,553 B2 | | 12/2008 | Hamman |
| 7,527,085 B2 | | 5/2009 | Iijima et al. |
| 7,762,314 B2 | | 7/2010 | Campbell et al. |
| 7,806,168 B2 | * | 10/2010 | Upadhya et al. ............ 165/80.4 |
| 7,971,632 B2 | | 7/2011 | Eriksen et al. |
| 8,066,057 B2 | | 11/2011 | Olesen et al. |
| 8,240,362 B2 | | 8/2012 | Eriksen |
| 8,245,764 B2 | | 8/2012 | Eriksen |
| 2002/0070007 A1 | | 6/2002 | Calaman et al. |
| 2003/0019234 A1 | | 1/2003 | Wayburn et al. |
| 2004/0042171 A1 | | 3/2004 | Takamatsu et al. |
| 2004/0042172 A1 | | 3/2004 | Kusaka et al. |
| 2004/0104010 A1 | | 6/2004 | Kenny et al. |
| 2004/0104012 A1 | | 6/2004 | Zhou et al. |
| 2004/0104022 A1 | | 6/2004 | Kenny et al. |
| 2004/0112585 A1 | | 6/2004 | Goodson et al. |
| 2004/0123614 A1 | | 7/2004 | Stewart |
| 2004/0182548 A1 | | 9/2004 | Lovette et al. |
| 2004/0182560 A1 | | 9/2004 | Kenny |
| 2004/0188066 A1 | | 9/2004 | Upadhya |
| 2004/0206477 A1 | | 10/2004 | Kenny et al. |
| 2005/0211417 A1 | | 9/2005 | Upadhya |
| 2005/0269061 A1 | | 12/2005 | Brewer et al. |
| 2006/0002088 A1 | | 1/2006 | Bezama |
| 2006/0096738 A1 | | 5/2006 | Kang et al. |
| 2006/0225867 A1 | | 10/2006 | Park et al. |
| 2007/0039719 A1 | | 2/2007 | Eriksen et al. |
| 2007/0163750 A1 | | 7/2007 | Bhatti et al. |
| 2007/0272392 A1 | | 11/2007 | Ghosh et al. |
| 2012/0175094 A1 | | 7/2012 | Rice |

FOREIGN PATENT DOCUMENTS

| | | | |
|---|---|---|---|
| JP | 2002151638 | 5/2002 | |
| JP | 2007180505 | 7/2007 | |
| JP | 2007227902 | 9/2007 | |
| JP | 2007531991 | 11/2007 | |
| TW | M273031 U | 8/2005 | |
| WO | 0165900 A1 | 9/2001 | |
| WO | WO 2005096377 A1 * | 10/2005 | ........... H01L 23/473 |
| WO | WO2006052317 A2 | 5/2006 | |

OTHER PUBLICATIONS

Chinese-language Search and Examination Reports dated Apr. 9, 2014, for Taiwan Patent Application No. 101110072 (English translation included); 40 pages total.

Examination Report dated Mar. 11, 2011, in European Patent Application No. 07075014.6; 9 pages total.

Kandlikar, S., High Flux Heat Removal with Microchannels—A Roadmap of Challenges and Opportunities, Heat Transfer Engr'g. 26(8):5-14 (2005).

Steineke, M. and Kandlikar, S., Single-Phase Heat Transfer Enhancement Techniques in Microchannel and Minichannel Flows, Microchannels and Minichannels—Jun. 17-19, 2004, Rochester, New York, USA (2004).

Preissuance Submission Dated Jan. 9, 2015, in U.S. Appl. No. 13/401,618.

Petition for Inter Parties Review of U.S. Pat. No. 8,746,330 in *Asetek Danmark A/S* v. *CoolIT Systems Inc.* filed May 27, 2015.

Declaration of Dr. Donald Tilton (including his CV) from Petition for Inter Parties Review of U.S. Pat. No. 8,746,330 in *Asetek Danmark A/S* v. *CoolIT Systems Inc.* dated May 27, 2015.

Roy W. Knight et al., "Heat Sink Optimization with Application to Microchannels," IEEE Transactions on Components, Hybrids, and Manufacturing Technology, vol. 15, No. 5, Oct. 1992, pp. 832-842.

Osinski, United States Patent and Trademark Office Decision of Institution of Inter Partes Review. Filed Dec. 9, 2015 in Case IPR2015-01276.

Pollard, United States Patent and Trademark Office Patent Owner's Response. Filed Mar. 9, 2016 in Case IPR2015-01276.

USPTO Patent Trial and Appeal Board Final Written Decision in Case IPR2015-01276 dated Dec. 8, 2016.

* cited by examiner

FLUID HEAT EXCHANGER CONFIGURED TO PROVIDE A SPLIT FLOW

CROSS REFERENCE TO RELATED APPLICATIONS

This application claims the benefit of and priority pending U.S. patent application Ser. No. 12/189,476, filed on Aug. 11, 2008, which claims benefit of and priority to U.S. Provisional Patent Application No. 60/954,987, filed on Aug. 9, 2007, each of which patent applications is hereby incorporated by reference in its respective entirety, for all purposes.

FIELD

The present invention is directed to a fluid heat exchanger and, in particular, a fluid heat exchanger for an electronics application such as in a computer system.

BACKGROUND

Fluid heat exchangers are used to cool electronic devices by accepting and dissipating thermal energy therefrom.

Fluid heat exchangers seek to dissipate to a fluid passing therethrough, thermal energy communicated to them from a heat source.

SUMMARY

In accordance with a broad aspect of the invention, there is provided a fluid heat exchanger comprising: a heat spreader plate including an intended heat generating component contact region; a plurality of microchannels for directing heat transfer fluid over the heat spreader plate, the plurality of microchannels each having a first end and an opposite end and each of the plurality of microchannels extending substantially parallel with each other microchannel and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening.

In accordance with another broad aspect of the present invention, there is provided a method for cooling a heat generating component comprising: providing a fluid heat exchanger including a heat spreader plate; a plurality of microchannels for directing heat transfer fluid over the heat spreader plate, the plurality of microchannels each having a first end and an opposite end and each of the plurality of microchannels having a continuous channel flow path between their first ends and their opposite ends; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends; mounting the heat spreader plate onto the heat generating component creating a heat generating component contact region where the heat generating component contacts the heat spreader plate; introducing a flow of heat exchanging fluid to the fluid heat exchanger; urging the flow of heat exchanging fluid through the fluid inlet into the plurality of microchannels first to a microchannel region between the ends of the microchannel; and, diverting the flow of heat exchanging fluid into a plurality of subflows that each flow away from the other, a first of the plurality of subflows flowing from the fluid inlet toward the first fluid outlet and a second of the plurality of subflows flowing from the fluid inlet toward the opposite fluid outlet.

It is to be understood that other aspects of the present invention will become readily apparent to those skilled in the art from the following detailed description, wherein various embodiments of the invention are shown and described by way of illustration. As will be realized, the invention is capable for other and different embodiments and its several details are capable of modification in various other respects, all without departing from the spirit and scope of the present invention. Accordingly the drawings and detailed description are to be regarded as illustrative in nature and not as restrictive.

BRIEF DESCRIPTION OF THE DRAWINGS

Referring to the drawings wherein like reference numerals indicate similar parts throughout the several views, several aspects of the present invention are illustrated by way of example, and not by way of limitation, in detail in the figures, wherein.

DESCRIPTION OF VARIOUS EMBODIMENTS

The detailed description set forth below in connection with the appended drawings is intended as a description of various embodiments of the present invention and is not intended to represent the only embodiments contemplated by the inventor. The detailed description includes specific details for the purpose of providing a comprehensive understanding of the present invention. However, it will be apparent to those skilled in the art that the present invention may be practiced without these specific details.

Figure 1:
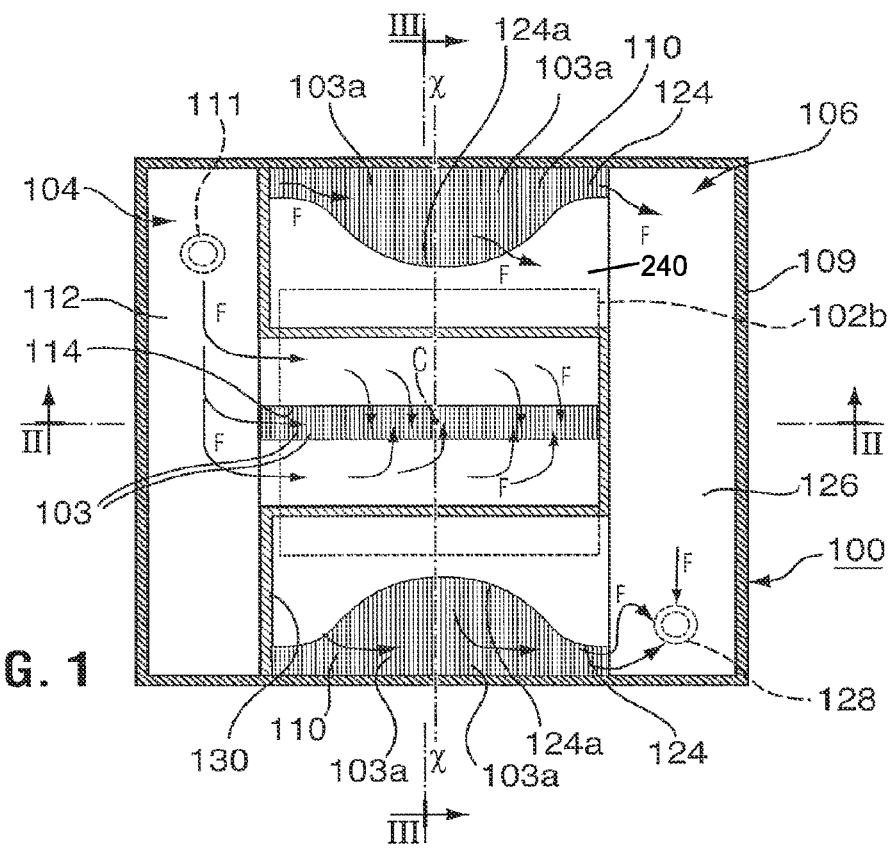
FIG. 1 is a top plan view of a fluid heat exchanger according to one embodiment of the invention, with the top cap cut away to facilitate viewing internal components.
Figure 2:
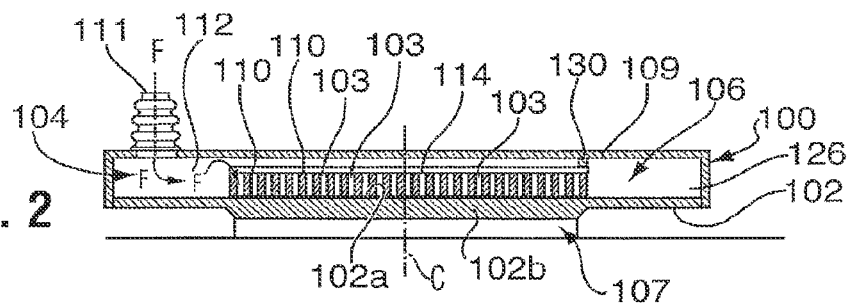
FIG. 2 is a sectional view along line II-II of FIG. 1.
Figure 3:
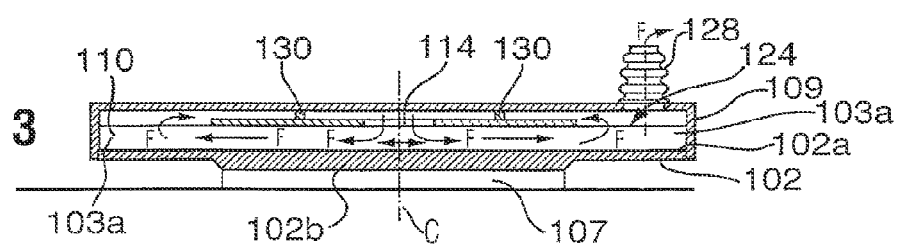
FIG. 3 is a sectional view along line III-III of FIG. 1.

With reference to FIGS. 1 to 3, a fluid heat exchanger 100 is shown. Fluid heat exchanger 100 includes a heat spreader plate 102, an arrangement of fluid microchannels 103 defined between walls 110, a fluid inlet passage 104, and a fluid outlet passage 106. A housing 109 operates with heat spreader plate 102 to form an outer limit of the heat sink and to define fluid flow passages 104, 106.

As shown in FIGS. 2 and 3, in use the heat exchanger 100 is coupled to a heat source 107, such as an electronic device, including, but not limited to a microchip or an integrated circuit. The heat exchanger may be thermally coupled to the heat source by a thermal interface material disposed therebetween, by coupling directly to the surface of the heat source, or by integrally forming the heat source and at least the heat spreader plate 102 of the fluid heat exchanger. The heat exchanger 100 may take various forms and shapes, but heat spreader plate 102 is formed to accept thermal energy from heat source 107. Heat spreader plate 102 includes an intended heat generating component contact region 102b positioned in a known location thereon. In the illustrated embodiment, heat spreader plate 102 includes a protrusion at region 102b that controls the positioning of the heat spreader plate relative to the heat source, but such a protrusion need not be included. Heat spreader plate 102 may include a portion of more conductive material to facilitate and control heat transfer, if desired. In any event, heat spreader plate is formed to fit over and thermally communicate with a heat source in a region 102b, usually located centrally relative to the edges of the heat spreader plate.

Microchannels 103 are formed to accept and allow passage therethrough of the flow of heat exchanging fluid such that the fluid can move along heat spreader plate 102 and walls 110 and accept and dissipate heat energy from them. In the illustrated embodiment, microchannels 103 are defined by walls 110 that are thermally coupled to the heat spreader plate to accept thermal energy therefrom. For example, heat spreader plate 102 may include an inner facing, upper surface 102a and a plurality of microchannel walls 110 may extend upwardly therefrom, whereby the channel area, defined between upper surface 102a and the microchannel walls 110, channels or directs fluid to create a fluid flow path. The channel area may be open or filled with thermally conductive porous material such as metal or silicon foam, sintered metal, etc. Thermally conductive, porous materials allow flow through the channels but create a tortuous flow path.

Surface 102a and microchannel walls 110 allow the fluid to undergo exchange of thermal energy from the heat spreader plate to cool the heat source coupled to the heat spreader plate. The upper surface 102a and walls 110 have a high thermal conductivity to allow heat transfer from the heat source 107 to fluid passing through channels 103. The surfaces forming channels 103 may be smooth and solid, formed with a porous structure, such as of sintered metal and/or metal or silicon foam or roughened, for example, including troughs and/or crests designed to collect or repel fluid from a particular location or to create selected fluid flow properties. Facing microchannel walls 110 may be configured in a parallel configuration, as shown, or may be formed otherwise, provided fluid can flow between the microchannel walls 110 along a fluid path. It will be apparent to one skilled in the art that the microchannel walls 110 may be alternatively configured in any other appropriate configuration depending on various factors of desired flow, thermal exchange, etc. For instance, grooves may be formed between sections of microchannel walls 110. Generally, microchannel walls 110 may desirably have dimensions and properties which seek to reduce or possibly minimize the pressure drop or differential of fluid flowing through the channels 103 defined therebetween.

The microchannel walls 110 may have a width dimension within the range of 20 microns to 1 millimeter and a height dimension within the range of 100 microns to five millimeters, depending on the power of the heat source 107, desired cooling effect, etc. The microchannel walls 110 may have a length dimension which ranges between 100 microns and several centimeters, depending on the dimensions of, and the heat flux density from, the heat source. In one embodiment, the walls 110 extend the full length (which may be a width) dimension of the heat spreader plate passing fully through region 102b. These are exemplary dimensions and, of course, other microchannel wall dimensions are possible. The microchannel walls 110 may be spaced apart by a separation dimension range of 20 microns to 1 millimeter, depending on the power of the heat source 107, although other separation dimensions are contemplated.

Other microporous channel configurations may be used alternatively to, or together with, microchannels, such as for example, a series of pillars, fins, or undulations, etc. which extend upwards from the heat spreader plate upper surface or tortuous channels as formed by a foam or sintered surface.

Fluid heat exchanger 100 further includes a fluid inlet passage 104, which in the illustrated embodiment includes a port 111 through the housing opening to a header 112 and thereafter a fluid inlet opening 114 to the microporous fluid channels 103.

The port and the header can be formed in various ways and configurations. For example, port 111 may be positioned on top, as shown, side or end regions of the heat exchanger, as desired. Port 111 and header 112 are generally of a larger cross sectional area than opening 114, so that a mass flow of fluid can be communicated substantially without restriction to opening 114.

Although only a single fluid inlet opening 114 is shown, there may be one or more fluid inlet openings providing communication from the header to the fluid microchannels 103.

Fluid inlet opening 114 may open to microchannels 103 opposite the heat spreader plate such that fluid passing through the opening may pass between walls 110 toward surface 102a, before being diverted along the axial length of the channels, which extend parallel to axis x. Since most installations will position the heat spreader plate as the lowermost, as determined by gravity, component of heat exchanger 100, the fluid inlet openings 114 can generally be described as being positioned above the microchannels 103 such that fluid may flow through opening 114 down into the channels in a direction orthogonal relative to the plane of surface 102a and towards surface 102a and then change direction to pass along the lengths of channels 103 substantially parallel to surface 102a and axis x. Such direction change is driven by impingement of fluid against surface 102a.

Fluid inlet opening 114 may be positioned adjacent to the known intended heat generating component contact region 102b since this region of the heat spreader plate may be exposed to greater inputs of thermal energy than other regions on plate 102. Positioning the fluid inlet opening adjacent region 102b seeks to introduce fresh heat exchanging fluid first and directly to the hottest region of the heat exchanger. The position, arrangement and/or dimensions of opening 114 may be determined with consideration of the position of region 102b such that opening 114 may be placed adjacent, for example orthogonally opposite to, or according to the usual mounting configuration above, the intended heat generating component contact region 102b on the heat plate. The delivery of fresh fluid first to the region that is in direct communication with the heat generating component to be cooled seeks to create a uniform temperature at the contact region as well as areas in the heat spreader plate away from the contact region.

In the illustrated embodiment, opening 114 is positioned to have its geometric center aligned over the center, for example the geometric center, of region 102b. It is noted that it may facilitate construction and installation by intending, and possibly forming, the heat sink spreader plate to be installed with the heat generating component positioned on the plate substantially centrally, with respect to the plate's perimeter edges, and then opening 114 may be positioned also with its geometric center substantially centrally with respect to the perimeter edges of the heat spreader plate. In this way, the geometric center points of each of opening 114, the heat spreader plate and the heat generating component may all be substantially aligned, as at C.

Opening 114 may extend over any channel 103 through which it is desired that heat exchange fluid flows. Openings 114 may take various forms including, for example, various shapes, various widths, straight or curved edges (in plane or in section) to provide fluid flow features, open area, etc., as desired.

Heat exchanger 100 further includes a fluid outlet passage 106, which in the illustrated embodiment includes one or more fluid outlet openings 124 from the microporous fluid channels 103, a header 126 and an outlet port 128 opening from the housing. Although two fluid outlet openings 124 are shown, there may be one or more fluid outlet openings providing communication to the header from the fluid channels 103.

The port and the header can be formed in various ways and configurations. For example, port 128 may be positioned on top, as shown, side or end regions of the heat exchanger, as desired.

Fluid outlet openings 124 may be positioned at the end of microchannels 103. Alternately or in addition, as shown, fluid outlet openings 124 may create an opening opposite heat spreader plate 102 such that fluid passing through the channels pass axially along the length of the channels between walls 110 and then changes direction to pass away from surface 102a out from between the walls 110 to exit through openings 124. Since most installations will position the heat spreader plate as the lowermost, as determined by gravity, component of heat exchanger 100, the fluid outlet openings 124 will generally be positioned above the microchannels 103 such that fluid may flow from the channels upwardly through openings 124.

Fluid outlet openings 124 may be spaced from fluid inlet openings 114 so that fluid is forced to pass through at least a portion of the length of channels 103 where heat exchange occurs before exiting the microchannels. Generally, fluid outlet openings 124 may be spaced from the known intended heat generating component contact region 102b.

In the illustrated embodiment, where heat exchanger 100 is intended to be mounted with heat source 107 generally centrally positioned relative to the perimeter edges of heat spreader plate 102, and thereby the ends 103a of channels, openings 124 may be positioned at or adjacent channel ends 103a.

At least one opening 124 extends over any channel 103 through which it is desired that heat exchange fluid flows. Openings 124 may take various forms including, for example, various shapes, various widths, straight or curved edges (in plane or in section) to provide fluid flow features, open area, etc. as desired.

Fluid inlet opening 114 may open away from the ends of the microchannels, for example along a length of a microchannel between its ends. In this way, fluid is introduced to a middle region of a continuous channel 103 rather than fluid being introduced to one end of a channel and allowing it to flow the entire length of the channel. In the illustrated embodiment, heat exchanger 100 is intended to be mounted with heat source 107 generally centrally positioned relative to the perimeter edges of heat spreader plate 102. As such, in the illustrated embodiment, opening 114 is positioned generally centrally relative to the edges of the heat plate 102. Since the channels, in the illustrated embodiment extend substantially continuously along the length of the heat plate between opposing side perimeter edges thereof, opening 114 opens generally centrally between ends 103a of each channel. For example, opening 114 may be positioned in the middle 50% of the heat exchanger or possibly the middle 20% of the heat exchanger. The delivery of fresh fluid to the central region where the heat generating component is in direct communication with the heat spreader plate, first before passing through the remaining lengths of channels seeks to create a uniform temperature at region 102b as well as areas in the heat spreader plate adjacent to the intended mounting position. The introduction of fluid to a region along a middle region of the microchannels after which the flow splits into two sub flows to pass outwardly from the inlet towards a pair of outlets, each of which is positioned at the ends of the channels reduces the pressure drop of fluid passing along the channels over that pressure drop that would be created if the fluid passed along the entire length of each channel. Splitting the fluid flow to allow only approximately one half of the mass inlet flow to pass along any particular region of the microchannels creates less back pressure and less flow resistance, allows faster fluid flow through the channels and lessens the pump force required to move the fluid through the heat exchanger.

In use, heat spreader plate 102 is positioned in thermal communication with heat source 107 at region 102b. Heat generated by heat source 107 is conducted up through heat spreader plate 102 to surface 102a and walls 110. Heat exchanging fluid, as shown by arrows F, enters the fluid heat exchanger through port 111, passes into the header 112 and through opening 114. The heat exchanging fluid then passes down between walls 110 into channels 103, where the fluid accepts thermal energy from the walls 110 and surface 102a. The heat exchanging fluid, after passing down into the channels, then impinges against surface 102a to be diverted toward ends 103a of the channels toward outlet openings 124. In so doing, in the illustrated embodiment, the fluid is generally split into two subflows moving away from each other and away from inlet 114 toward openings 124 at the ends of the microchannels. Fluid passing through channels becomes heated, especially when passing over the region in direct contact with the heat source, such as, in the illustrated embodiment, the central region of the heat spreader plate. Heated fluid passes out of openings 124, into header and thereafter through port 128. The heated fluid will circulate through a heat sink where its thermal energy is unloaded before circulating back to port 111.

The individual and relative positioning and sizing of openings 114 and 124 may allow fluid to circulate through the heat exchanging channels 103 while reducing the pressure drop generated in fluid passing through heat exchanger 100, when compared to other positionings and sizings. In the illustrated embodiment, for example, the central region 124a of outlet openings 124 are scalloped to offer an enlarged outlet region from the centrally located channels, relative to those on the edges. This shaping provides that the outlet openings from some centrally positioned channels 103, relative to the sides of the heat exchanger, are larger than the outlet openings from other channels closer to the edges. This provides that fluid flowing through the more centrally located channels encounters less resistance to flow therethrough, again facilitating flow past the central mounting region 102b on heat spreader plate 102.

A seal 130 separates fluid inlet passage 104 from fluid outlet passage 106 so that fluid must pass through the microporous channels 103 past heat spreader plate surface 102a.

Figure 5:
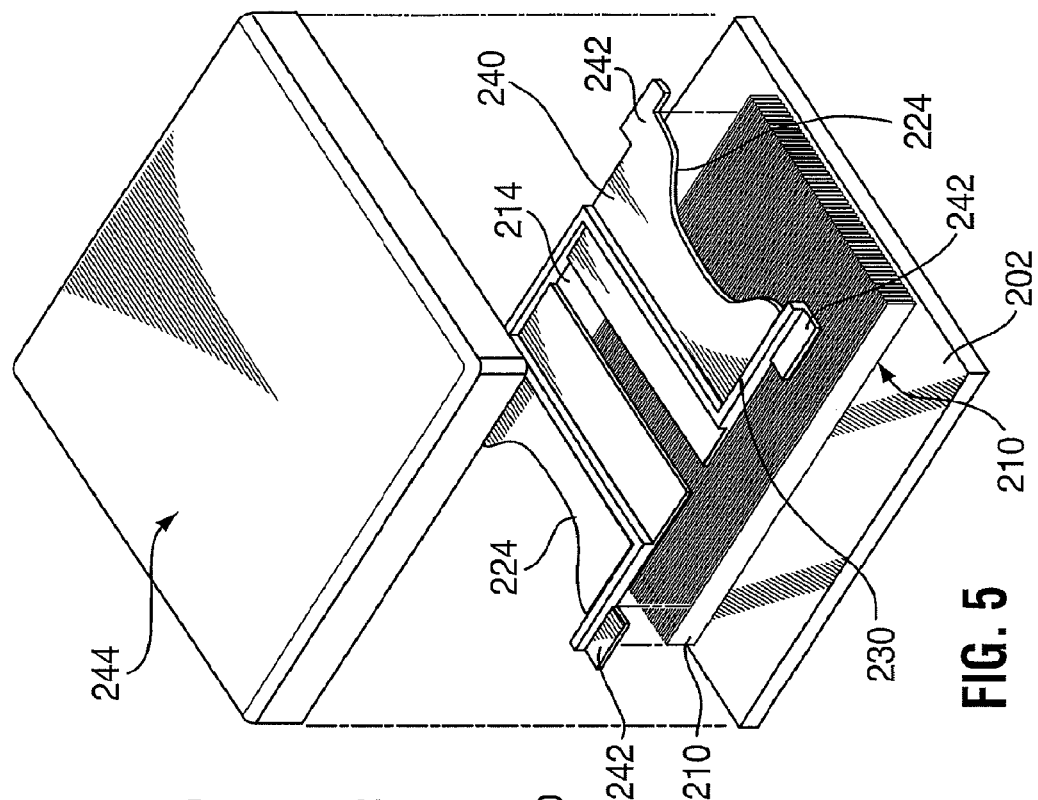
FIG. 5 is a top plan view of the fluid heat exchanger of FIG. 4 assembled with its top cap removed.
Figure 4:
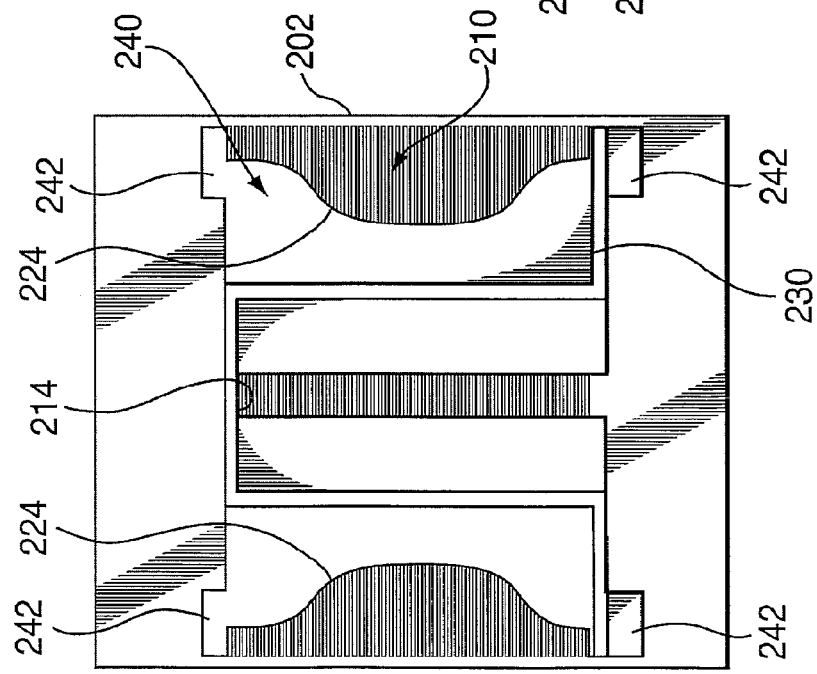
FIG. 4 is an exploded, perspective view of a fluid heat exchanger according to another embodiment of the invention.

With reference to FIGS. 4 and 5, a useful method for manufacturing a fluid heat exchanger is described. A heat spreader plate 202 may be provided which has heat conductive properties through its thickness at least about a central region thereof.

Microchannels may be formed on the surface of the heat spreader plate, as by adding walls or forming walls by building up or removing materials from the surface of the heat plate. In one embodiment, skiving is used to form walls 210.

A plate 240 may be installed over the walls 210 to close off the channels across the upper limits of walls 210. Plate 240 has portions removed to create inlet and outlet openings 214 and 224, respectively, in the final heat exchanger. Tabs 242 may be used to assist with the positioning and installation of plate 240, wherein tabs 242 are bent down over the two outermost walls.

Seal 230 may be installed as a portion of plate 240 or separately.

After plate 240 and seal 230 are positioned, a top cap 244 can be installed over the assembly. Top cap 244 can include side walls that extend down to a position adjacent heat spreader plate.

The parts may be connected during assembly thereof or afterward by overall fusing techniques. In so doing, the parts are connected so that short circuiting from inlet passage to outlet passage is substantially avoided, setting up the fluid circuit as described herein above wherein the fluid flows from opening 214 to openings 224 through the channels defined between walls 210.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are know or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

I claim:

1. A fluid heat exchanger for cooling an electronic device, the heat exchanger comprising:
    a plurality of spaced-apart walls defining a corresponding plurality of microchannels having respective first ends and second ends;
    a plate positioned over the plurality of walls and partially closing off the plurality of microchannels;
    an elongate inlet opening in fluid communication with each of the microchannels, wherein an inlet flow path to each respective microchannel is positioned between the respective first ends and second ends;
    an outlet opening in fluid communication with each of the microchannel first ends, wherein a corresponding outlet flow path from each of the microchannel first ends is positioned laterally outward of the plate relative to the inlet flow path to the respective microchannel, wherein the plurality of spaced-apart walls comprises a first outermost wall and a second outermost wall spaced apart from and opposite the first outermost wall relative to the plurality of microchannels, wherein the outlet flow path from a centrally positioned microchannel first end positioned between the first outermost wall and the second outermost wall is larger than the outlet flow path from another microchannel first end positioned adjacent the first outermost wall, the second outermost wall, or both;
    a housing positioned over and spaced apart from the plate, wherein the housing has an inlet port and an outlet port spaced apart from each other, wherein the inlet port is in fluid communication with each respective inlet flow path and the outlet port is in fluid communication with each respective outlet flow path from the microchannel first ends; and
    a seal extending between the housing and the plate and separating the inlet flow path to each of the microchannels from the outlet flow path from each of the microchannel first ends, wherein each respective inlet flow path is split generally into two subflow paths, wherein one of the subflow paths extends outwardly toward the corresponding microchannel first end and passes outwardly of the plate along the outlet flow path from the respective microchannel first end.

2. A fluid heat exchanger according to claim 1, wherein the other of the two subflow paths extends outwardly toward the corresponding microchannel second end.

3. A fluid heat exchanger according to claim 1, wherein the two subflow paths are directed away from each other.

4. A fluid heat exchanger according to claim 1, further comprising a spreader plate, wherein the plurality of spaced-apart walls extends upwardly of the spreader plate, wherein the housing contacts the spreader plate.

5. A fluid heat exchanger according to claim 4, wherein the spreader plate is thermally coupled with each of the plurality of spaced-apart walls and wherein a portion of one or more of the outlet flow paths extends between the plate positioned over the plurality of walls and the housing before the respective one or more flow paths pass through the outlet port.

6. A fluid heat exchanger according to claim 1, wherein the plurality of spaced-apart walls are substantially parallel to each other.

7. A fluid heat exchanger according to claim 1, wherein each of the spaced-apart walls has a width dimension within the range of 20 microns to 1 millimeter and a height dimension within the range of 100 microns to five millimeters.

8. A fluid heat exchanger according to claim 1, wherein each of the walls is separated from an adjacent wall by a separation dimension within the range of 20 microns to 1 millimeter.

9. A fluid heat exchanger according to claim 1, wherein the outlet port is positioned adjacent a distal end of the elongate inlet opening.

10. A fluid heat exchanger according to claim 1, wherein the plate closing off the plurality of microchannels extends between the elongate inlet opening and the microchannel first ends, and a portion of one or more outlet flow paths from the microchannel first ends extends between the plate closing off the plurality of microchannels and the housing.

11. A fluid heat exchanger according to claim 10, wherein the plate closing off the plurality of microchannels extends between the elongate inlet opening and the microchannel second ends.

12. A fluid heat exchanger according to claim 1, wherein the plurality of spaced-apart walls comprises a first outermost wall and a second outermost wall spaced apart from the first outermost wall, wherein the plate positioned over the plurality of walls comprises at least one bent tab extending over the first outermost wall and arranged to position the plate relative to the plurality of walls.

13. A fluid heat exchanger according to claim 12, wherein the at least one bent tab comprises a first bent tab, where the plate further comprises a second bent tab extending over the second outermost wall.

14. A fluid heat exchanger according to claim 1, wherein the seal is a portion of the plate.

15. A fluid heat exchanger for cooling an electronic device, the heat exchanger comprising:
a plurality of walls defining a corresponding plurality of microchannels extending from respective first ends to respective second ends;
an elongate inlet opening to the microchannels and defining an inlet flow path to each respective microchannel at a position between the respective first ends and the respective second ends;
a plate positioned over the plurality of walls to close off the plurality of microchannels between each respective elongate inlet flow path and a corresponding outlet flow path positioned outward of the plate and extending from the respective microchannel adjacent the corresponding first end, and wherein the plate is positioned over the plurality of walls to close off the plurality of microchannels between each respective inlet flow path and a corresponding opposed outlet flow path positioned outward of the plate and extending from the respective microchannel adjacent the corresponding second end;
a housing positioned over and spaced apart from the plate, wherein the housing has an inlet port and an outlet port spaced apart from each other; and
a seal extending between the housing and the plate and separating the inlet flow path to each respective microchannel from both corresponding outlet flow paths from the respective microchannel, wherein each respective inlet each respective flow path splits generally into two subflow paths after entering the corresponding microchannel, wherein one of the two subflow paths extends outwardly toward the corresponding microchannel first end and the other of the two subflow paths extends outwardly toward the corresponding microchannel second end, wherein the subflow path toward the microchannel first end passes from the respective first end along the corresponding outlet flow path e, wherein the outlet flow path from a centrally located first end is larger than the outlet flow path from a first end spaced apart from the centrally located first end.

16. A fluid heat exchanger according to claim 15, wherein the inlet port is positioned adjacent a proximal end of the elongate inlet opening to the microchannels and the outlet port is positioned adjacent a distal end of the elongate inlet opening to the microchannels.

17. A fluid heat exchanger according to claim 15, wherein at least one subflow path extending toward the corresponding microchannel second end passes from the respective second end along the corresponding outlet flow path.

18. A fluid heat exchanger according to claim 15, wherein the outlet flow path from a centrally located second end is larger than the outlet flow path from a second end spaced apart from the centrally located second end.

19. A fluid heat exchanger according to claim 15, further comprising a spreader plate, wherein the plurality of walls extends upwardly of the spreader plate and the housing contacts the spreader plate.

20. A fluid heat exchanger according to claim 19, wherein the spreader plate is thermally coupled with each of the plurality of walls.

21. A fluid heat exchanger according to claim 15, wherein the plurality of walls are substantially parallel to each other.

22. A fluid heat exchanger according to claim 15, wherein each of the walls has a width dimension within the range of 20 microns to 1 millimeter and a height dimension within the range of 100 microns to five millimeters.

23. A fluid heat exchanger according to claim 15, wherein each of the walls is separated from an adjacent wall by a separation dimension within the range of 20 microns to 1 millimeter.

24. A fluid heat exchanger according to claim 15, wherein at least one of the outlet flow paths extends over the plate defining the elongate inlet manifold and between the plate defining the elongate inlet manifold and the housing.

25. A fluid heat exchanger according to claim 19, wherein the inlet flow path to each respective microchannel is positioned opposite the spreader plate.

26. A fluid heat exchanger according to claim 15, wherein the inlet flow path to each respective microchannel is positioned generally centrally between the corresponding ends of the respective microchannels.

27. A fluid heat exchanger according to claim 15, wherein the plurality of spaced-apart walls comprises a first outermost wall and a second outermost wall spaced apart from the first outermost wall, wherein the plate positioned over the plurality of walls comprises a bent tab extending over the first outermost wall and arranged to position the plate relative to the plurality of walls.

28. A fluid heat exchanger according to claim 15, wherein the seal is a portion of the plate.

29. A fluid heat exchanger for cooling an electronic device, the heat exchanger comprising:
a plurality of walls defining a corresponding plurality of microchannels extending between respective first ends and second ends, wherein the plurality of walls comprises a first outermost wall and a second outermost wall;
a plate defining an elongate inlet aperture opening to the microchannels at a position between the respective first ends and second ends, wherein the plate is positioned over the plurality of walls to close off the plurality of microchannels between the elongate inlet aperture and an outlet opening from the microchannels adjacent the first ends, and between the elongate inlet aperture and an opposed outlet opening from the microchannels adjacent the second ends, wherein the elongate inlet aperture extends between a proximal end and a distal end, wherein the first outermost wall is positioned adjacent the proximal end of the elongate aperture and wherein the second outermost wall is positioned adjacent the distal end of the elongate aperture, wherein the outlet opening adjacent the first ends and the opposed outlet opening adjacent the second ends define smaller openings from the microchannels adjacent the first and the second outermost walls compared to openings from a centrally located microchannel positioned between the first and the second outermost walls;

a housing positioned over and spaced apart from the plate, wherein the housing has an inlet port in fluid communication with the inlet aperture and an outlet port in fluid communication with the outlet opening adjacent the first ends and the opposed outlet opening adjacent the second ends, wherein the inlet port and the outlet port are spaced apart from each other, wherein the housing includes a downwardly extending sidewall; and a seal extending between the housing and the plate and separating the inlet aperture from the outlet opening adjacent the first ends and the opposed outlet opening adjacent the second ends, wherein a fluid flow from the inlet port is in fluid communication with the elongate inlet aperture opening to the plurality of microchannels and wherein an inlet flow to the microchannels is split generally into two outwardly directed subflows in the microchannels toward the respective outlet opening adjacent the first ends and the opposed outlet opening adjacent the second ends, wherein the subflow directed toward the outlet opening adjacent the microchannel first ends passes from the first ends.

30. A fluid heat exchanger according to claim 29, wherein the plate defines a first tab bent to extend down over the first outermost wall and a second tab bent to extend down over the second outermost wall, wherein the tabs are configured to align the plate relative to the plurality of walls, wherein the subflow path directed toward the outlet opening adjacent the microchannel second ends passes from the second ends.

31. A fluid heat exchanger according to claim 29, wherein the outlet opening from the microchannels adjacent the first ends is coextensive with the first ends of the microchannels, and wherein the outlet opening from the microchannels adjacent the second ends is coextensive with the second ends of the microchannels.

32. A fluid heat exchanger according to claim 29, wherein the seal is a portion of the plate.

* * * * *